US007666259B2

(12) United States Patent
Thorne et al.

(10) Patent No.: US 7,666,259 B2
(45) Date of Patent: Feb. 23, 2010

(54) SCREENING AND CRYSTALLIZATION PLATES FOR MANUAL AND HIGH-THROUGHPUT PROTEIN CRYSTAL GROWTH

(75) Inventors: Robert E. Thorne, Ithaca, NY (US); Viatcheslav Berejnov, Ithaca, NY (US); Yevgeniy Kalinin, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 358 days.

(21) Appl. No.: 11/463,033

(22) Filed: Aug. 8, 2006

(65) Prior Publication Data

US 2007/0034140 A1 Feb. 15, 2007

Related U.S. Application Data

(60) Provisional application No. 60/706,375, filed on Aug. 8, 2005.

(51) Int. Cl.
*C30B 7/14* (2006.01)
(52) U.S. Cl. .................... 117/68; 117/69; 422/245.1
(58) Field of Classification Search .................. 117/68, 117/69; 422/245.1
See application file for complete search history.

(56) References Cited

U.S. PATENT DOCUMENTS 5,096,676 A * 3/1992 McPherson et al. ......... 117/206

7,470,324 B2 * 12/2008 Hoffmann .................... 117/68
2003/0159641 A1 8/2003 Sanjoh et al.
2004/0187958 A1 9/2004 Viola et al.

OTHER PUBLICATIONS

Quere, D. and Bico, J. "Controlled Wetting by Surface Patterning." Houille Blanche-Revue Int. De L Eau. 2003. pp. 21-24.
McPherson, A. "Crystallization of Biological Macromolecules." (1999). pp. 176-196.
Daoura, M. J. and Meldrum, D. R. "Precise Automated Control of Fluid Volumes Inside Glass Capillaries" IEEE Journal of Microelectromechanical Systems, vol. 8, No. 1, Mar. 1999. pp. 71-77.
Meldrum, D. R. et al. "ACAPELLA-1K, A Capillary-Based Submicroliter Automated Fluid Handling System for Genome Analysis" Genome Res. 10(1): (2000). pp. 95-104.
Zheng, B. et al. "Screening of Protein Crystallization Conditions on a Microfluidic Chip Using Nanoliter-Size Droplets." (2003). J. Am. Chem. Soc. 9 vol. 125, No. 37, 2003. pp. 11170-11171.

(Continued)

*Primary Examiner*—Robert M Kunemund
(74) *Attorney, Agent, or Firm*—Jones, Tullar & Cooper, P.C.

(57) ABSTRACT

In one embodiment, a crystallization and screening plate comprises a plurality of cells open at a top and a bottom, a frame that defines the cells in the plate, and at least two films. The first film seals a top of the plate and the second film seals a bottom of the plate. At least one of the films is patterned to strongly pin the contact lines of drops dispensed onto it, fixing their position and shape. The present invention also includes methods and other devices for manual and high-throughput protein crystal growth.

49 Claims, 8 Drawing Sheets

OTHER PUBLICATIONS

Zheng, B. et al. "Formation of Arrayed Droplets by Soft Lithography and Two-Phase Fluid Flow, and Application in Protein Crystallization." Adv. Mater. 16(15), 2004. pp. 1365-1368.

Zheng, B. et al. "A Droplet-Based, Composite PDMS/Glass Capillary Microfluidic System for Evaluating Protein Crystallization Conditions by Microbatch and Vapor-Diffusion Methods with On-Chip X-Ray Diffraction" Angew. Chem. Int. Edit. 43(19). 2004 pp. 2508-2511.

Kalinin, Y. and Thorne, R. E. "Crystal growth in X-ray-transparent plastic tubing an alternative for high-throughput applications" Acta Cryst. D61, 2005, pp. 1528-1532.

Berejnov, V. and Thorne, R.E. "Enhancing drop stability in protein crystallization by chemical patterning." Acta Cryst. D61, 2005, pp. 1563-1567.

Kalinin, Y. et al. , "A new sample mounting technique for room-temperature macromolecular crystallography" J. Appl. Cryst. 38, 2005, pp. 333-339.

Abbott, N. L. et al. "Manipulation of the Wettability of Surfaces on the 0.1 to 1-Micrometer Scale Through Micromachining and Molecular Self-Assembly." Science 257, 1992. pp. 1380-1382.

Xia, Y. et al. "Surface patterning and its application in wetting/dewetting studies" (2001). Current Op. in Colloid & Interface Sci. 6, 2001. pp. 54-64.

Andersen, J. V. et al. "Pinning of a solid-liquid-vapor interface by stripes of obstacles." Phys. Rev. E vol. 53. No. 5. 1996, pp. 5006-5010.

Buehrle, J. et al. "Impact of Line Tension on the Equilibrium Shape of Liquid Droplets on Patterned Substrates." Langmuir, vol. 18, No. 25, 2002, pp. 9771-9777.

Yoshimitsu, Z., et al. "Effects of Surface Structure on the Hydrophobicity and Sliding Behavior of Water Droplets" Langmuir, vol. 18, No. 15, 2002. pp. 5818-5822.

Callies, M. et al. "Microfabricated textured surfaces for super-hydrophobicity investigations" Microelectronic Engineering 78-79, 2005. pp. 100-105.

Crysel, W. B. et al. "The international space station X-ray crystallography facility." Journal of Crystal Growth. 232. 2001. pp. 458-467.

B. Zheng, et al. "Using nanoliter plugs in microfluidics to facilitate and understand protein crystallization." Current Opinion in Structural Biology, 15, 2005, pp. 548-555.

Neuro Probe, Inc., Protein Crystallography. 2006. http://www.neuroprobe.com/products/crystallography.html.

Greiner Bio One, Protein Crystallization catalog. http://www.greinerbioone.com/en/usa/articles/catalogue/articles/605_10.

Corning, Inc. Corning Life Sciences Catalog. http://catalog2.corning.com/Lifesciences/en-US/Search/search.aspx?searchfor=protein+crystallization&selprodids=.

Hampton Research, Crystallization Plates & Accessories. 2003. http://www.hamptonresearch.com/products/Subcategory.aspx?cid=10.

Art Robbins Instruments, Crystallography Products. 2004. http://web.archive.org/web/20070607180623/www.artrobbinsinstruments.com/crystallography.html.

Fluidigm, Corporation, The TOPAZ® System—Protein Crystallization by Fluidigm. http://www.fluidigm.com/topaz.htm.

Protein Crystallography Times, vol. 1, No. 2, Mar. 2009 www.rigaku.com/downloads/newsletter/LifeSciencesV01N02.html.

http://www.nexusbio.com/Images/products_images/ProteinCrystal_images/pc_well.jpg.

Kalinin et al. "Controlling microdrop shape and position for biotechnology using micropatterned rings", Microfluidics and Nanofluidics 5: 449-454 (2008).

Kalinin et al "Contact line pinning by microfabricated patterns: Effect of microscale topography", Langmuir 25 (9), 5391-5397 (2009).

Soliman et al. "X-ray Transparent Crystallization Plates for High Performance Crystallization" presented in Apr. 2009 at a Protein Structure Initiative Meeting at the NIH in Bethesda, MD.

\* cited by examiner

SCREENING AND CRYSTALLIZATION PLATES FOR MANUAL AND HIGH-THROUGHPUT PROTEIN CRYSTAL GROWTH

REFERENCE TO RELATED APPLICATIONS

This application claims an invention which was disclosed in Provisional Application No. 60/706,375, filed Aug. 8, 2005, entitled "SCREENING AND CRYSTALLIZATION PLATES FOR MANUAL AND HIGH-THROUGHPUT PROTEIN CRYSTAL GROWTH". The benefit under 35 USC § 119(e) of the provisional application is hereby claimed, and the aforementioned application is hereby incorporated herein by reference.

ACKNOWLEDGMENT OF GOVERNMENT SUPPORT

This invention was made with Government support under Grant No. NAG-1831, awarded by NASA, and by Grant No. R01-GM65981, awarded by the NIH.

BACKGROUND OF THE INVENTION

1. Field of the Invention

The invention pertains to the field of X-ray crystallography. More particularly, the invention pertains to apparatuses and methods for growing crystals for X-ray crystallography.

2. Description of Related Art

Small molecule and macromolecular X-ray crystallography are a central component of modern structural genomics and drug discovery efforts. Despite the introduction of high-throughput methods, obtaining crystals of suitable size and quality for X-ray diffraction studies remains an important bottleneck in determining structures of biological macromolecules. Solution conditions (pH, salt type and concentration, protein concentration) that yield crystal growth must be identified, and then optimized to yield crystals with adequate diffraction resolution for structure determination.

Vapor diffusion is the most common method for growing crystals of proteins, viruses and biomolecular assemblies, as well as of small molecule compounds that may be useful as drugs. As shown in FIG. 8, in the manual (low-throughput) version of this technique, a drop of protein solution (50) is placed on a glass or plastic coverslip (51) that is held in an injection molded plastic frame (54). This coverslip (51) is then suspended over a reservoir (52) containing a solution (53) with a lower initial vapor pressure than that of the drop (achieved, e.g., by having a higher salt concentration or by adding polyethylene glycols.) The reservoir is sealed using clear plastic tape or a clear plastic sheet (55), and water is removed from the drop as it equilibrates with the reservoir solution, increasing the protein concentration until nucleation and crystal growth occur.

In the sitting drop method (FIG. 8(a)), the drop (50) sits on top of the supporting substrate (e.g., a coverslip (51)) and so crystals tend to sediment onto it. In the hanging drop method (FIG. 8(b)), the substrate (51) is inverted so that the drop (50) hangs from its bottom, and crystals sediment to the liquid-air interface. These hanging drops often yield crystals with unperturbed facets, show less cracking and have smaller mosaicities, and (in the absence of protein "skins") are easily retrieved for diffraction studies. Consequently, hanging drops are preferred for final crystallization trials to obtain the largest, highest-quality crystals for data collection. In both hanging and sitting drop methods, crystals often adhere to the supporting substrate. Because protein crystals are so fragile, removing them without damaging them is often difficult.

Crystals are also grown by the batch method, where the drop is maintained at approximately uniform vapor pressure either by eliminating the reservoir solution, by choosing a reservoir solution vapor pressure equal to that of the drop, or by coating the drop in a water-impermeable oil. Since there is no water removal and associated concentration variations in time, the batch method samples only a single point in crystallization phase space. It is thus less efficient in identifying crystallization conditions than screening methods based on vapor (or liquid) diffusion.

Because of the difficulties associated with manipulating glass or plastic coverslips, especially in a high-throughput environment, injection molded multiple-cell clear plastic crystallization plates (34) (FIGS. 5(a) and 5(b)) are now widely used, especially in the initial search for solution conditions that yield crystallization. Each cell (35) in the plate (34) generally has one or more small wells (36) for the protein solution (39) and a larger well (37) for the "reservoir" or protein-free solution (38) to be equilibrated against. Solutions are dispensed into the corresponding wells, and the top of the plate is sealed using transparent tape or plastic sheets. Some manufacturers of plates for protein crystallization include Greiner Bio-One in Germany, Corning (Corning, N.Y.), Art Robbins Instruments (Sunnyvale, Calif.), Hampton Research (Aliso Viejo, Calif.) and Neuroprobe (Gaithersburg, Md.). Common drop volumes used in high throughput experiments are 2 µl or smaller. Manual crystallization to obtain large crystals for final diffraction studies may use ~20 µl volumes.

A somewhat different crystallization plate design has been manufactured by Nextal Biotechnologies (Montreal, Canada), recently acquired by Qiagen (Venlo, Netherlands). This design is shown in FIGS. 11(a) through 11(c), and described in U.S. Patent Publication 2004/0187958. In this design, the reservoirs in the plate (70) are sealed using a screw-in cap (71) that has multiple circular ridges producing cylindrical wells (72) on its bottom (inner) side. Drops are dispensed into these cylindrical wells, and then the cap is inverted and screwed into the plate. This approach implements the hanging drop method. Light piping effects by the cylindrical walls make visualization of crystals difficult. In addition, the plate is not X-ray transparent and the walls and bottom of the cylinder provide a large surface area of plastic to which crystals may adhere, making retrieval difficult.

Protein Wave Corporation (Kyoto, Japan) has marketed thin lithographically etched sheets of an X-ray transparent polymer for use with standard crystallization plates, some aspects of which are described in U.S. Patent Publication 2003/0159641. As shown in FIGS. 12(a) and 12(b), these sheets (73) are comprised of an array of cells (74). In each cell, there is a structure with circular holes or rings (75), as well as tabs (76) that hold the structure to the sheet. These tabs allow the hole-containing structure to be easily detached from the sheet and inserted into a holder.

In use, the sheets (73) are inserted into standard multiple well plates (77) that contain the reservoir solution. Protein drops are dispensed into the circular holes (75) (instead of wells that are an integral part of the plate), and then the plate is sealed with transparent tape and equilibration of the drops and reservoir occurs. Cells that have crystals are cut open, the drop-holding structure is removed by breaking the tabs, and the structure with drops is then inserted into an X-ray beam to examine any crystals.

Because these sheets are used with standard plates, they do not allow in-situ X-ray examination. Since drops typically contain multiple crystals and large amounts of solvent, only crystal diffraction quality can be evaluated. For full molecular structure determination, crystals must still be retrieved from the drops using other tools and examined by X-rays individually. Because the drops are only supported at their edges, accelerations that occur in dispensing and routine handling lead to large drop motions and limit the volumes of liquid that can be stably supported. Consequently, a separate well is required to contain the reservoir solution with which the drops equilibrate. Because the circular rings are quite wide and are not isolated (being directly connected to the tabs and other parts of the sheet structure within the cell), the drop's contact line may occupy many positions between the inner and outer edges of the rings and even displace to other parts of the sheet structure (depending on the drop's history, its chemical composition, and its tendency to wet the sheet material), so the drop shape and position are not reproducible.

Each drop has two (top and bottom) curved, optically distorting surfaces which makes optical recognition of crystals inside difficult. Since protein "skins" (comprised of degraded or aggregated protein) often form at drop-air interfaces, the presence of two skins for these edge-supported drops makes retrieval of individual crystals for full structure analysis difficult. The instability of the edge-supported drops also makes retrieval of individual crystals for full structure determination more difficult.

Other approaches to high-throughput protein crystallization are being pursued. For example, Fluidigm (San Francisco, Calif.) has commercialized a platform based on microfluidic chips. Although these allow crystallization with very small volumes, retrieving crystals for X-ray diffraction studies is difficult, and the chips are presently very expensive compared with crystallization plates. Fluidigm's products are based on a completely different technology than the automated liquid handlers/drop dispensers that are now widely available in both academic and industrial laboratories, and do not appear to have sufficient advantages in general purpose crystallization to justify their cost.

High-throughput growth by dispensing large numbers of drops into glass or plastic capillaries is also being investigated (see, for example, B. Zheng, C. J. Gerdts and R. F. Ismagilov, Cur. Op. Struct. Biol. 15, 548-555 (2005), incorporated herein by reference), but seems unlikely to be broadly competitive with crystallization plate based methods.

Aside from these commercial technologies, there is a large body of prior art from the scientific community. Drops have been dispensed onto thin, X-ray permeable nylon loops or onto thin films and the crystals that have grown have been examined by directing X-rays through the film or loop without removing the crystals. Crystals have frequently been grown by dispensing protein and reservoir drops into X-ray transparent glass capillaries, which provide cylindrical drop support, and allow crystals to be examined by X-rays in situ. Crystals have been grown on the microfabricated grids with arrays of holes that are used in electron microscopy, including those that are X-ray permeable.

Problems with Current Technology

One of the most striking aspects of the high-throughput crystallization plates currently marketed for use with automated drop dispensing systems is how similar they all are in their basic design and function. They all have several shortcomings:

1. Most of the prior art plates implement the sitting drop technique, which yields inferior crystals to the hanging drop method. Inverting the plates to obtain hanging drops causes the contents of the reservoir and protein wells to spill out and mix.

2. Removing crystals from the plates is a difficult, time-consuming operation and at present must be done manually. Crystals often stick to the plates, and can be damaged when they are dislodged, reducing yields.

3. Although the contents of each cell can be examined optically, the protein-containing drops have irregular shapes and irreproducible positions because of their interaction with the plate surfaces. In particular, protein drops tend to be drawn to corners at the edge of the cell where they wet both the bottom and the side. This complicates automated recognition of crystals. Curved bottom wells produce more regular drops but create their own optical distortion. Flat bottom wells provide better optics but more irregularly shaped and positioned drops, and retrieving crystals from them can be more difficult.

4. The reservoir solutions are also drawn to the corners and edges of the cell, so that the shape and surface area of this solution is irregular from well to well for equal solution volumes.

5. Irregular shapes for both the protein and reservoir solutions lead to irregular surface-to-volume ratios and thus irreproducible crystallization kinetics, so that repeating and/or scaling up conditions that produced a "hit" to larger volumes to obtain larger crystals often yields no crystals.

6. Because all commercial plates are made from thick, strongly X-ray absorbing and scattering plastic, X-ray diffraction cannot be used to assess crystal quality in situ. X-rays provide the most direct method for assessing both the presence of crystals in a drop and the crystalline order of crystals present. Much time is wasted manually retrieving, mounting, flash cooling and measuring the X-ray diffraction properties of well-faceted crystals that do not diffract adequately. Although the Protein Wave design (FIG. 12) allows crystals to be grown and then extracted on an X-ray transparent holder, the process of extraction and mounting in the X-ray beam is more cumbersome than conventional methods using standard plates and separate X-ray transparent tools.

These shortcomings have a large negative impact on screening efficiency and on the overall throughput of structural genomics efforts. The average cost of determining a new protein structure is $50,000-$100,000. Given the low cost of the plates themselves compared with the costs incurred because of their deficiencies, it makes strong economic sense to replace them with a technology that is better designed to meet the demands of the high-throughput environment.

SUMMARY OF THE INVENTION

The present invention teaches devices and methods for manual and high-throughput protein crystal growth and growth of other biological and organic crystals. In one embodiment, a crystallization and screening plate comprises a plurality of cells open at a top and a bottom, a frame that defines the cells in the plate, and at least two films. The first film seals a top of the plate and the second film seals a bottom of the plate. One of the films is preferably chemically or topographically patterned to strongly pin the contact lines of drops dispensed onto it at particular positions, producing drops with well defined positions, boundaries and shapes.

Both films can be X-ray transparent, allowing in situ X-ray examination of crystal quality.

DETAILED DESCRIPTION OF THE INVENTION

Figure 1A:
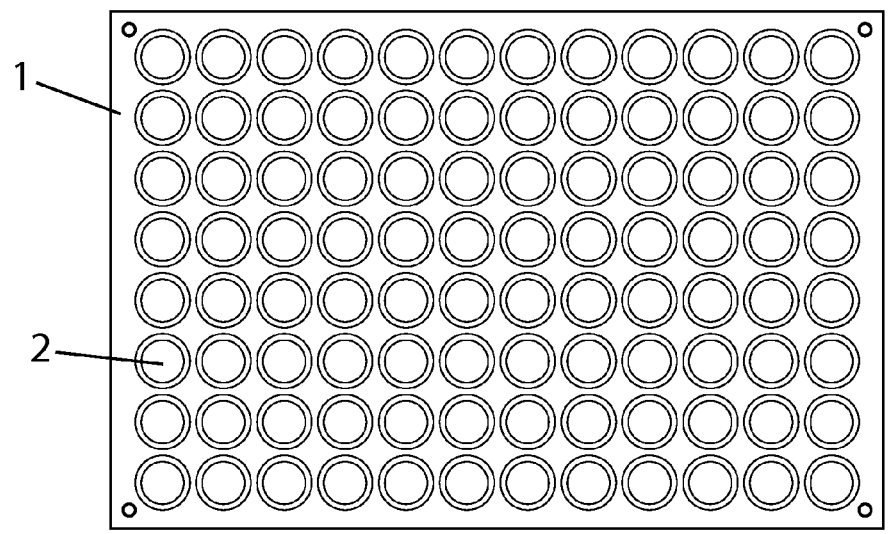
FIG. 1(a) shows a top view of a plate in one embodiment of the present invention, with round cells.
Figure 1B:
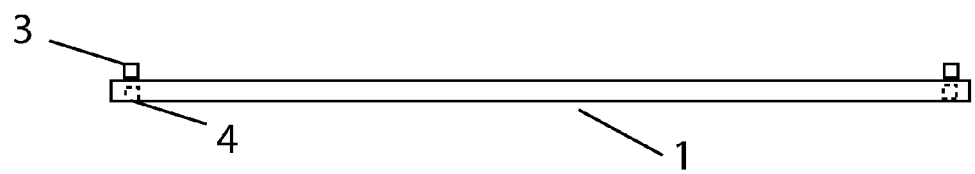
FIG. 1(b) shows a side view of FIG. 1(a).
Figure 1C:
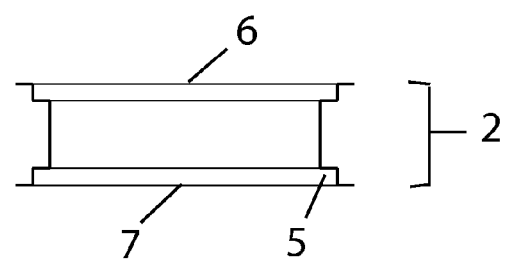
FIG. 1(c) shows a side view of a single cell of the plate of FIG. 1(a).
Figure 1D:
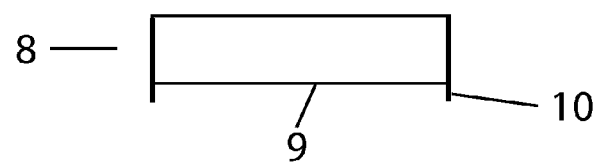
FIG. 1(d) shows a side view of a cutting tool for removing plastic films that seal top and bottom of the plate of FIG. 1(a).

The crystallization apparatuses and methods of the present invention may be used to crystallize proteins or any other biological or organic molecules suitable for crystallization. Some examples include, but are not limited to, protein-protein complexes, cellular organelles, viruses, and small molecule organic compounds that are drug targets. Although "protein drop" and "protein-containing drop" are generally used throughout the application, crystallization of any molecule-containing drop is encompassed by the present invention. A reservoir drop, as defined herein, is a drop that is free of the molecule that is to be crystallized. By vapor exchange, the reservoir drop helps to bring the molecule-containing drop into conditions favorable for crystallization.

The present invention is an apparatus for growing protein crystals that resolves the problems of reproducible drop positioning and shape and of X-ray transparency and allows crystals to be grown in both hanging and sitting drops. The overall apparatus preferably has a large number of identical cells. Popular commercial crystallization plates have 24, 96, 384, or 1536 cells per plate in an area of 85×127 mm (3⅜×5"). The plates of the present invention also preferably have 24, 96, 384, or 1536 cells per plate in an area of 85×127 mm (3⅜×5"); however other cell numbers and plate sizes are possible.

The crystallization plates of the present invention are preferably X-ray transparent, allowing in situ evaluation of the results of crystallization trials by X-ray diffraction without the need to remove the crystals from the plate. In the present invention, the "wells" of conventional plates are replaced with open cells whose top and bottom are sealed by thin X-ray transparent films. These films and the injection-molded (or stamped) open-cell frame that supports them are preferably impermeable to water vapor, alcohols and other volatile components of protein crystallization solutions on time scales (hours to weeks) relevant to crystallization experiments.

Because of the small volumes of protein drops typically used in crystallization ($\leq 2$ µl), the preferred embodiment of the present invention does not use wells to contain the protein drops. With sufficiently impermeable plate materials, the reservoir solution volume may be reduced to 50 µl or smaller, and in a preferred embodiment is also "contained" without the use of wells. Containment and much greater control over drop position, drop shape, drop stability and equilibration/nucleation/crystallization kinetics are obtained by using chemical and/or topographic surface patterning to strongly pin both protein and reservoir drop contact lines at well defined positions. With this approach, the plate may be used for both hanging and sitting drops. Because there are no wells and liquid volumes are small, the plate thickness can be reduced to slightly larger than the height of the liquid drops. This reduces required storage volumes required for the plates, improves crystallization kinetics, maximizes free solid angles for X-ray scattering from crystals within the drops, and simplifies crystal retrieval from the plate.

Figure 2A:
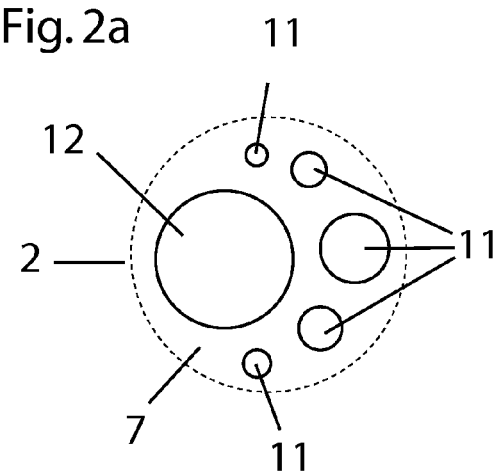
FIG. 2(a) shows a top view of the film pattern for holding drops in a single circular cell, for one of the films that seals the top and bottom of the cells of the plate of FIG. 1(a).
Figure 2B:
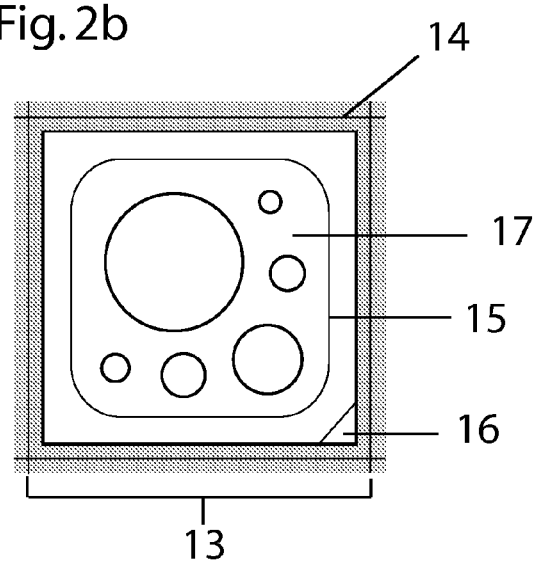
FIG. 2(b) shows a top view of a single rectangular cell in a crystallization plate of the present invention, and the film pattern for holding drops.

FIGS. 1-4 show several related plate designs. They include a thin injection-molded (or stamped) plastic frame defining the individual cells and two thin, optically and X-ray transparent films that seal via an adhesive to the top and bottom of the cells. The films are preferably sufficiently thin (100 microns or thinner) to allow crystals to be examined by X-rays that are directed through one film, through a drop containing a crystal, and then through another film, without excessive background X-ray scattering by the films. At the same time, the films are of a design to produce acceptably small levels of water transport through the films during the course of crystallization experiments. In FIGS. 1 and 2, one (or both) of these films is patterned to "contain" the protein and reservoir drops and localize them at specific positions. To use these plates, drops are dispensed onto the patterned film, and then the plate is sealed using the second film to allow equilibration.

Not only do these designs outperform conventional crystallization plates, but they are very economical to manufacture. In particular, the injection-molded frame has an extremely simple design, lowering the cost of molds. In one embodiment, the frames may be stamped from plastic or metal. Unlike conventional plates which must have excellent clarity to allow tiny crystals within them to be visualized, the frames need not have any optically smooth surfaces since nothing is imaged through them, which cuts the cost of molds in half. The frames need not even be transparent, and are preferably made of any impermeable material. Furthermore, since the films define the drop positions, the number, sizes and positions of the drops may be easily modified with no large capital costs, allowing rapid design prototyping, optimization and customization.

The individual components of the crystallization plate include the following:

Frame

As shown in FIG. 1, a thin (preferably approximately 2-4 millimeter thick) frame (1) with good rigidity defines the cells (2) in the plate, in which individual crystallization experiments are performed. FIG. 1(*a*) shows a frame (1) for a circular cell. FIG. 2(*b*) shows a frame (13) with a rectangular cell. FIG. 4(*a*) shows a single cell in an embodiment with capillary-like tubes (23). The frame is preferably made of plastic or a corrosion-resistant metal including, but not limited to, aluminum. The frame preferably matches the format of popular commercial crystallization plates, which have 24, 96, and 384 cells per plate in an area of 85×127 mm (3⅜×5"), and preferably matches the gripping tools of popular automated plate handling systems. The frame may have corrugations, grooves or similar features to enhance its rigidity to bending.

The small thickness (determined by the drop height) reduces storage requirements in high-throughput applications by roughly a factor of 5 compared with prior art crystallization plates. It also suppresses vapor convection during equilibration of the protein-containing and reservoir solutions (which is also an advantage of growth in capillaries). This slows equilibration and produces conditions more favorable for nucleation of a small number of crystals. The small thickness and large cell width-to-thickness ratio maximizes the free solid angle through which X-rays can be incident onto and diffracted from crystals without encountering the frame.

The cells are preferably fully open at the top and bottom, so that the view of drops within is unobstructed by the frame material. Consequently, the frame material need not be optically transparent or even translucent, and may be injection molded or stamped from any material that is chemically inert and resistant and has minimal permeability and absorption of water, alcohol and other volatile components of crystallization solutions. Some materials for the plate include, but are not limited to, polystyrenes and related polymers, because they have good rigidity necessary for a thin plate.

FIGS. 1(*a*) through 1(*c*) and FIG. 2(*a*) show a plate (1) with cylindrical cells (2). In a preferred embodiment, the cells (2) have dimensions of 10 mm diameter ×3 mm height (consistent with a 96 cell format). The circular cell geometry allows a cutting blade (10) of a circular cutting tool (8) to remove the drop-free thin covering film (6) by cutting along the inner circumference of the cell (2), rotating to facilitate cutting action. This permits easy access to crystals on the opposite patterned film (7) without the need to use scissors or cutting knives. Alternatively, a circular cutting tool with a vacuum/suction grip or a tacky/adhesive surface (9) can cut the patterned film (7), removing and holding a film disk containing the crystals. The removed disk and shallow depth provide 180° access to the crystals and even easier retrieval. Both drops and crystals should easily survive the required manipulations. In one embodiment, the edges of each cell are preferably indented (5) to facilitate cutting of the plastic film, and the film design may assist in the cutting, as described below.

A rectangular cell (13) shown in FIG. 2(*b*) provides a larger working area and a more uniform cell wall thickness than the circular cell (2) shown in FIG. 1(*a*). This complicates design and use of a film-cutting tool if the film (17) is to be cut along the inner perimeter (15) of the cell. In a preferred embodiment, the surface of the plate may have a grid of "vee" grooves (14) bisecting the frame between cells. A razor blade or other straight cutting edge may then cut the film around a desired cell. In one embodiment, to make removal of the film easier, the frame beneath one corner of each cell preferably has a small triangular indentation (16) to which the film does not adhere, allowing the edge of the cut film to be easily gripped and peeled off.

Each cell in the frame may contain a reservoir well, as in conventional crystallization plates, with only the protein containing drops "contained" on the film surface. This may in some cases produce a smaller "footprint" for the reservoir liquid compared to a drop confined by surface patterning, but eliminates the option of hanging drops and degrades reproducibility of equilibration since the reservoir liquid does not assume a reproducible shape and surface-to-volume ratio within the reservoir well.

To facilitate alignment of the plastic films when they are applied to the frames and also to facilitate stacking, in one embodiment the frames preferably have small tapered posts (3) or alignment pins at the corners of the top of the frame and small mating indentations (4) or holes in the bottom. Other features such as indentations in the side of the plate or tabs protruding from it may be added to facilitate plate manipulation by automated systems.

Some design considerations to be considered when designing and prototyping the frame are (1) choice of frame material for chemical inertness, water impermeability, mechanical rigidity, and ease of sealing (polystyrene being the preferred material); (2) choice of fabrication/manufacturing method (e.g., injection molding, stamping) and (3) choice of geometry for optimum crystallization performance and crystal retrieval.

Films

An important feature of the crystallization plates of the present invention is that the top and bottom of the frame are both sealed by thin films, rather than having one side sealed by an integral part of the frame itself. The thin films are preferably made of plastic. Each cell must be sealed well enough so that the volume of water that evaporates from the cell over the time of the crystallization experiment (typically a few days to a few weeks) is small compared with the starting volumes (typically 10-20 μl). Consequently, the films must have low permeability to water vapor and other volatile constituents used in crystallization. They must be optically clear to allow easy examination of protein drops for crystals. They may be X-ray transparent to allow in-situ examination, which requires that they be made of low atomic number, low density materials (preferably e.g., a plastic), be very thin (preferably <100 μm), and have limited orientation of their molecules. Suitable films of, e.g., polypropylene, are available from Chemplex Industries (Palm City, Fla.), which provides these films for X-ray transparent experimental enclosures. The films may be patterned chemically or topographically to define the drop position and shape and inhibit lateral motion. The regions where protein crystals grow should be thin to allow crystals that have adhered to the film to be removed by flexing. This requires a thickness (which determines the minimum radius of curvature) that is smaller than the size of the crystals to be removed, which are typically 100 μm or less in small protein drop volume, high throughput crystallization.

One simple solution to these constraints using topographic patterning is shown in FIG. 2. The patterned, drop-containing film (7) has two layers in addition to an adhesive gasket that holds the film to the frame (1). Alternatively, the gasket may use other types of bonding, including, but not limited to, thermal bonding, to hold the film to the frame. One layer is very thin (preferably 10-25 μm or less) and continuous. The second layer is patterned with holes (11, 12) that define the positions of the protein (11) and reservoir (12) drops, and may be much thicker (preferably 50 μm or more). The thickness steps produced by the holes in the thick layer strongly pin the edges of the drop contact lines, providing drop position and shape reproducibility and drop stability in both sitting and hanging drop configurations. The strong contact line pinning also inhibits permanent drop deformation due to accelerations that occur during handling. Note that the thickness steps are too small to physically "contain" the drops as in the wells of conventional plates (as milk is contained in a glass), as their height is much smaller than the drop height. The drop position and shape are instead fixed by pinning of the drop's contact line.

To provide additional drop pinning and stability, a hydrophilic polymer may be used for the thin layer and a hydrophobic polymer for the thick layer, producing chemical as well as topographic contrast.

To facilitate cutting and removal of the film, in this embodiment the thicker film is preferably patterned with a perforated (or continuous) ring just inside the perimeter of the frame, so that the cutter need only cut through the thinner film.

Figure 10A:
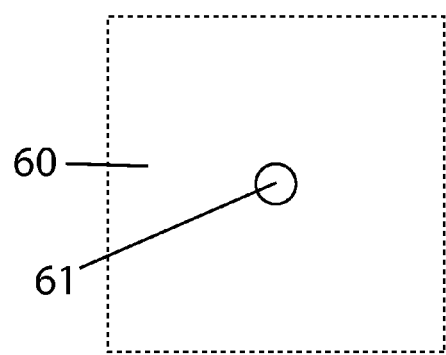
FIG. 10(a) shows a substrate that has been patterned with a circular region to provide strong drop contact line pinning.
Figure 10B:
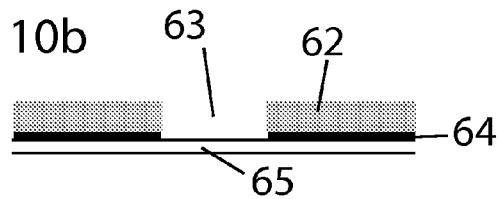
FIG. 10(b) shows a method for creating the circular pattern of FIG. 10(a), involving gluing a film with holes to a second continuous layer.
Figure 10C:
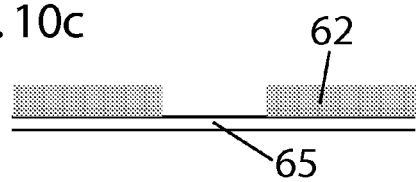
FIG. 10(c) shows another method for creating the circular pattern of FIG. 10(a), involving laminating a plastic layer with holes to a second continuous layer.
Figure 10D:
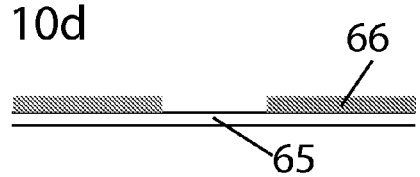
FIG. 10(d) shows another method for creating the circular pattern of FIG. 10(a), involving deposition and patterning of a film onto a second continuous layer.
Figure 10E:
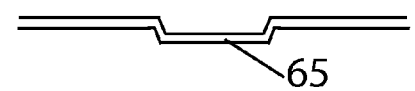
FIG. 10(e) shows another method for creating the circular pattern of FIG. 10(a), by embossing a thin continuous layer.
Figure 10F:
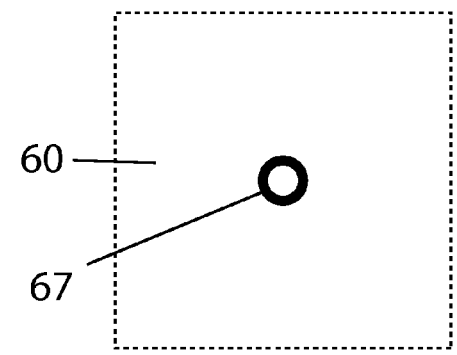
FIG. 10(f) shows a substrate that has been patterned with a narrow annular region or ring to provide strong drop contact line pinning.

FIGS. 10(a) through 10(i) show several alternative methods for patterning the film (or a solid substrate) to obtain strong pinning of drop contact lines. FIG. 10(a) shows a film (60) with a single circular patterned region (61). FIG. 10(b) shows a thick film (62) with a hole (63) glued with an adhesive layer (64) to a continuous thin film (65), as discussed above. In FIG. 10(c), the thick film (62) and thin film (65) are thermally bonded. In FIG. 10(d), a layer of a second optically transparent material (66) is deposited either by printing (contact or ink-jet), by stamping, or by coating and then using, e.g., optical lithography to selectively remove the coating from the drop positions. In FIG. 10(e), the thin film (65) is patterned by embossing using a stamp and die.

Circular areas can be replaced by annular rings (67) to provide strong pinning of the liquid contact line, as shown in FIGS. 10(f) through 10(i). The rings must have a small width (much smaller than the drop radius, or preferably ~5-100 μm in this case) so that the contact line and drop position are well-defined. As in the two-layered film discussed above, the thickness of the ring can be quite small (1-10 μm) and still provide strong contact line pinning. The rings can be of common inert materials including, but not limited to, photoresists, polyimide or PDMS that are easily patterned. Because the ring width is so small, it need not be optically transparent, so the range of possible ring materials is quite large. Depending on the material used for these rings, they may provide chemical as well as topographic contrast with the supporting film. Note that a hydrophobic or hydrophilic character of the ring—and any difference in this character from that of the film—is not essential to its ability to strongly pin the drop contact line.

Figure 10G:
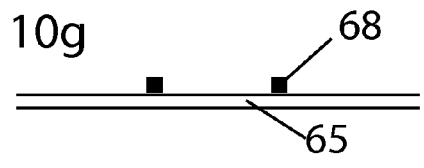
FIG. 10(g) shows a method for creating the ring pattern of FIG. 10(f), involving deposition and patterning of a film onto a second continuous layer.
Figure 10H:
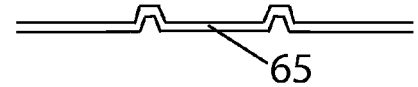
FIG. 10(h) shows another method for creating the ring pattern of FIG. 10(f), by embossing a thin continuous layer.

In FIG. 10(g), the ring (68) is formed by printing (contact or ink-jet), by stamping, or by coating and then using, e.g., optical lithography to selectively remove the coating from all positions but the ring. In FIG. 10(h), the ring is formed by embossing the thin film (65).

Figure 10I:
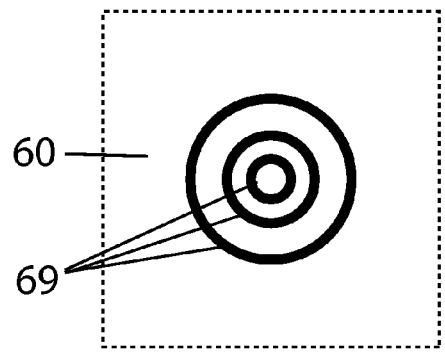
FIG. 10(i) shows a substrate that has been patterned with a concentric series of narrow rings to provide strong drop contact line pinning for drops of widely different volumes.
Figure 11A:
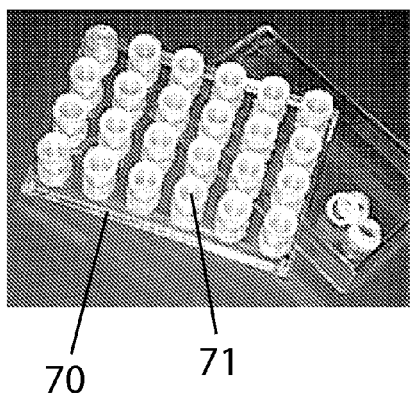
FIG. 11(a) shows a prior art crystallization plate.
Figure 11B:
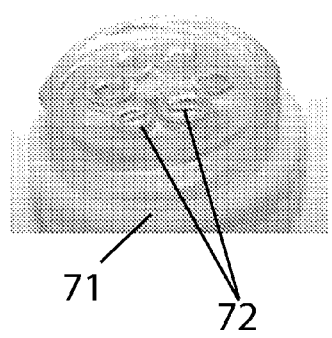
FIG. 11(b) shows caps with wells for containing drops that screw in to the plate of FIG. 11(a).
Figure 11C:
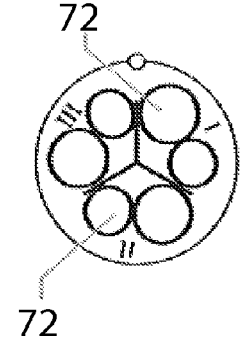
FIG. 11(c) shows the pattern of wells in the cap of the FIG. 11(b).
Figure 12A:
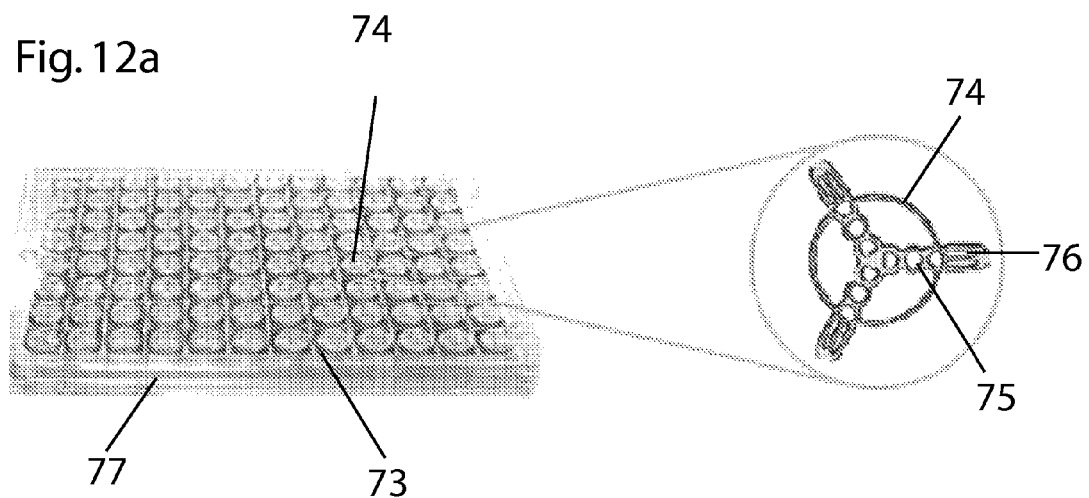
FIG. 12(a) shows another prior art crystallization system, based on a standard crystallization plate and a thin, X-ray transparent plastic film that is inserted into the plate and holds the protein drops.
Figure 12B:
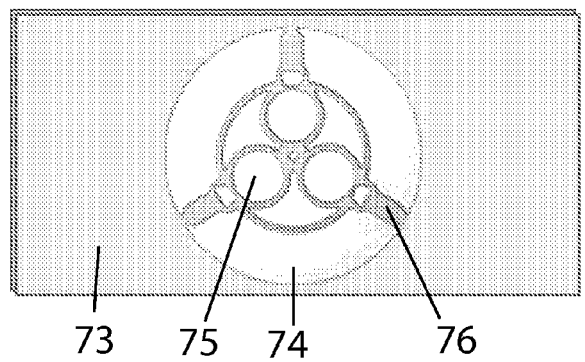
FIG. 12(b) shows a detail of the plastic film pattern in one cell of the crystallization plate of FIG. 12(a).

FIG. 10(i) shows that multiple concentric rings (69) can be patterned to localize drops with a wide range of volumes on a single location, providing more efficient use of cell surface area than if rings of different diameters for drops of different volumes are separately patterned (as for the circular patterns in FIG. 2(a).) Larger drop volumes will be captured by larger diameter rings.

Each cell preferably has an assortment of hole or ring sizes for use with different volume protein drops. The holes or rings need not be circular, but may have other shapes including, but not limited to, an elliptical shape, to, e.g., maximize liquid volume while maximizing the space between drops. Assuming contact angles of 90°, the radii of drops with volumes of 20, 2 and 0.2 μl are 2.1, 1.0 and 0.45 mm, respectively. The relatively large diameter of even "nanoliter" drops permits a variety of hole patterning methods.

The small thickness of the continuous layer beneath the drops provides excellent X-ray transparency, and allows flexing for easy removal of adhered crystals. Commercially available polymer films (e.g., polypropylene or polyolefin) as thin as 6 μm are sufficiently impermeable to water vapor for this application. In two-layer films, the larger thickness of a second layer as in FIGS. 10(b) and 10(c) can increase the barrier to vapor diffusion, and provide good mechanical rigidity to simplify attaching the film to the frame. To facilitate drop dispensing by hand, in one embodiment the thicker layer is preferably tinted or its surface textured to make the hole positions more visible.

The film materials preferably contain very low (ppm) concentrations of metals or other heavy elements for maximum X-ray transmission and minimum background scattering, absorption and fluorescence.

Although the method described above may be the cheapest and simplest way to strongly pin drop contact lines, a wide variety of other approaches have been demonstrated in recent years. Some of these approaches are discussed in Abbott, N. L., Folkers, J. P. and Whitesides, G. M. (1992). Science 257, 1380-1382; Xia, Y. N., Qin, D. et al. (2001). Current Op. Colloid Interface Sci. 6, 1380-1382; Andersen, J. V. and Brechet Y. (1996). Phys.1 Rev. E 53 5006-5010; Buehrle, J., Herminghaus, S. et al. (2002). Langmuir 18, 9771-9777; Yoshimitsu, Z., Nakajima, A. et al. (2002). Langmuir 18, 5818-5822; Quere, D. and Bico, J. (2003). Houille Blanche-Revue Int. De L Eau 21-24; Callies, M., Chen, Y., et al. (2005). Microelectronic Engineering 78-79, 100-105. These references are herein incorporated by reference.

The drops dispensed onto the patterned films have much greater shape and positional reproducibility than those dispensed into standard crystallization plates. As a result, optical imaging and automated image recognition of crystals within the drops is easier. Improved drop shape reproducibility also improves the reproducibility of drop surface-to-volume ratios and thus drop equilibration rates with the reservoir drop, which in turn improves the reproducibility of crystallization experiments. Even when this design is not X-ray transparent, these other advantages make this crystallization plate design extremely attractive.

For X-ray examination of crystals in situ, it may be advantageous if the crystals adhere to the film surface, since the plate may then be examined in any orientation, including the vertical orientation required to use the horizontal beams of standard lab X-ray sources. To promote this adhesion, the film beneath the drop may be patterned with a grid, similar to the grid found in Mitegen's (Ithaca, N.Y.) MicroMesh™ mounts. Electron microscope grids placed on crystallization slides have been used to promote crystal adhesion for atomic force microscopy studies.

The bottom and top films preferably cover the entire frame. The film on the side of the frame opposite the drop-supporting film preferably is comprised of a single (≦100 μm) X-ray transparent layer. If a thick layer is needed for mechanical (e.g., ease of handling) or permeability properties, a two-layer film with holes in the thick layer that line up with those on the drop-containing film may be used.

In one embodiment, for automated handling of plates, the plastic films are preferably bar coded to identify the plate, and also preferably have printed codes identifying each cell.

In another embodiment, to reduce evaporation further, a solid plastic cap or cover that comes in firm contact with the plates is preferably added.

An adhesive gasket is preferably used to attach at least the top (drop-free) film to the frame, allowing sealing after the drops have been deposited. The bottom patterned film may instead be attached during manufacturing by thermal bonding. The adhesive gasket has openings where the crystallization cells open up in the frame. It is also preferably moisture impermeable if possible, and pressure sensitive. For ease of assembly, it is preferably pre-attached to the plastic films, and covered with a protective peel-off liner or sheet that is removed before use. The liner can be much thicker than the plastic film, and therefore provide rigidity when the film is applied to the frame. Clear plastic, adhesive-backed and lined sheets are sold by Greiner Bio-One as an alternative to clear plastic sealing tape to seal their crystallization plates, although these sheets are quite thick and scatter X-rays strongly.

In one embodiment, to further simplify handling of a film, it may be attached around its edges to a thicker plastic or metal frame.

A major advantage of this design over conventional crystallization plates is that the same frame may be used with a wide variety of film patterns, and the frames require only the most rudimentary injection molding capabilities. Customizing crystallization configurations requires only customization of the films, which is done much more easily and inexpensively than creating new injection molds for frames.

As an alternative to using a two-layer laminated film or a chemically and/or topographically patterned film, the hole pattern that defines the boundaries of drops resting on the bottom film may be fabricated (e.g., injection molded) as part of the frame. In this embodiment, the bottom film may be sealed to the frame using thermal bonding, by an adhesive that is applied to the bottom of the frame, or by a (more complex) adhesive gasket. The sealing of the film to the hole patterns on the bottom of the frame must be tight and uniform to prevent leakage, so additional care is required in gluing or thermal bonding of the film. The thickness of the plastic holes should be minimized (preferably 1 mm or less) to facilitate crystal retrieval. This embodiment requires more complex molds for the frame and that the frame be changed for each required crystallization pattern although, unlike prior art plates, there is no need for optically flat surfaces.

Preferred Methods of Use

To use this crystallization system, there are many different modes of possible operation.

In a first embodiment, the patterned bottom film is pre-attached to the frame. Drops containing the molecule or biological object (e.g., virus, protein complex) to be crystallized as well as any reservoir solution with which the crystallizing drops are to be equilibrated are then rapidly dispensed through the frame and onto the patterned bottom film, either using a manual pipetter or an automated drop dispensing system. Then the top film is sealed to the frame. The ability to stably support both the crystallization drop and the reservoir drop on the same surface is a unique feature of this design compared with existing crystallization plates, made possible by the strong contact line pinning provided by the surface patterning.

In a second embodiment, the top film is attached to the frame, and drops are dispensed through the frame onto the bottom film. The frame is then pressed down onto the bottom film to seal the cells.

Bar codes or other markings on the film may be used to align the patterned film in a robotic dispenser and to tell the dispenser the film pattern and thus the drop pattern to be dispensed. Codes may also be added to the frame.

The frame is preferably kept with drops on the bottom film, for sitting drop growth, or the frame is rotated 180 degrees to obtain hanging drops. The strong contact line pinning keeps all of the drops (including the "reservoir" drop) from sliding during the rotation.

The sealed crystallization system is then preferably inspected periodically using an optical imaging system, as in current practice.

Each protein-containing drop in each cell may also be examined in situ using an X-ray beam. The beam preferably has an area equal to the area of the protein-containing drop. It is preferably shone directly through the top and bottom films, normal to the plane of the films. The beam preferably exits through the film that contains the drops to maximize the solid angle through which crystals within the drop can diffract X-rays without encountering the frame. Commercial systems exist for directing the X-rays both horizontally and vertically, so that the plate can be examined in either orientation.

To remove crystals from a cell for full X-ray structure determination or other manipulations, the film is preferably cut and removed from one side of the cell using any of the methods discussed in the previous section. A nylon loop (for example, one sold by Hampton Research) or a microfabricated mount (for example, one sold by Mitegen) may be used to retrieve the crystal from a drop in the cell. To allow easier access to the crystal-containing drop, the "reservoir" solution may be removed by pipetting.

Alternatively, the portion of the drop-containing film in a particular cell may be removed and held using an appropriate tool, allowing 180 degree access to the crystal-containing drop and easier retrieval.

Alternative Embodiments

Figure 3A:
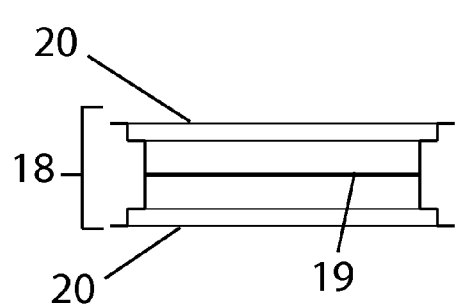
FIG. 3(a) shows a side view of a plate in another embodiment of the present invention, with a central hole-containing sheet for liquid drops.
Figure 3B:
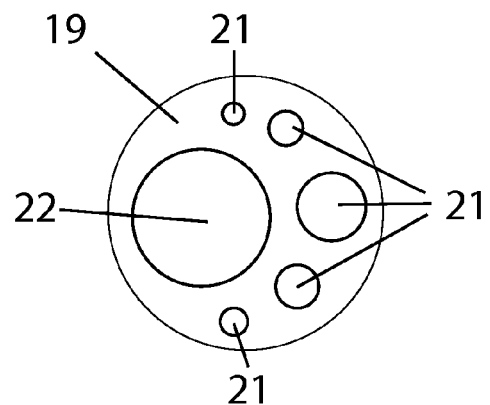
FIG. 3(b) shows a top view of the sheet that spans a single cell in the plate of FIG. 3(a).

FIGS. 3 and 4 show two other plate designs that are based on the same open cell concept. They also may optionally be X-ray transparent. In FIG. 3, each cell (18) is spanned by a thin sheet (19) (preferably 1 mm or thinner) located roughly half-way between the top and bottom cell surfaces. As shown in FIG. 3(b), in each cell the sheet (19) contains a series of holes (21, 22) that define the perimeters of the protein-containing (21) and reservoir (22) drops. In one embodiment, the sheet (19) is part of the frame of the cell (18). In another embodiment, the frame of the cell (18) is split in two and the sheet (19) is a separate film that is sandwiched during manufacturing between the two halves of the frame.

In both embodiments, the cells (18) are sealed top and bottom by single-layer, optically and preferably X-ray transparent films (20). The split-frame second embodiment can use a central sheet or film with through holes to hold the drops. Unlike the Protein Wave design and the design taught in U.S. Patent Publication 2003/0159641, this film need not be X-ray transparent since the X-ray beam incident during in situ examination only strikes crystals within the holes; the drop holders within the individual cells are not designed to be removable; the film is an integral part of the assembled plate; and it is used in a plate with open cells and that is sealed top and bottom with X-ray transparent films, allowing in-situ X-ray examination without removing the crystal-containing portion of the film.

Although the hole-containing sheet may be an integral part of the injection-molded frame, a two-piece frame and a separate patterned film or sheet that are assembled by gluing, adhesive sheets, or thermal bonding in manufacturing provides more flexibility. As discussed above, new frame designs require new (expensive) injection molds, whereas new film patterns are easily and cheaply produced. For films with holes, they can easily be produced by stamping.

This edge-supported-drop design based on through holes is made possible by the small drop volumes now used in high-throughput screening, which are stably supported by this method. This design reduces the problem of crystal nucleation on and adhesion to supporting surfaces, simplifying crystal retrieval. Some disadvantages of this design include reduced drop stability and maximum volumes compared with drops supported on pattern surfaces, more optical distortion because of the more complex drop shape, and the formation of two protein skins on the two surfaces that can impede crystal retrieval. Drop stability is a problem mainly for the larger volume reservoir solution.

Unlike in the Protein Wave design, the crystals within a drop can be examined in situ by X-ray diffraction, so there is no need to remove the drop support from the frame for X-ray examination, and the problems of protein skins are important only if crystals are to be removed for further characterization. Since the drops are edge supported, there is no need to invert the plate to get hanging drops. Consequently, a well may be added to the frame to contain the reservoir solution if necessary.

Instead of having holes, the central drop supporting film can be chemically or topographically patterned using any of the methods discussed above and shown in FIG. 10, to strongly pin drop contact lines. Although a simple punched film may be simplest, chemical or topographic patterning provides additional control and flexibility.

Figure 4A:
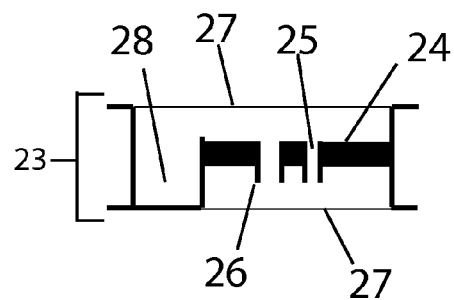
FIG. 4(a) shows one cell of a plate in another embodiment of the present invention, with "capillary" tubes to hold drops.

FIG. 4(a) shows a single cell (23) of another embodiment in which the holes in the central drop supporting member (24) are extended to form tubes (25), similar to capillary tubes. The ends of the tubes are open, allowing (more constricted) X-ray access and optical imaging. Crystals sediment to the bottom liquid-air interface, as in hanging drop crystallization.

The extension of the holes to tubes increases (by capillary action) the volume of the liquid that may be supported for a given diameter compared to an edge supported drop. The exposed surface area-to-volume ratio is reduced. This slows equilibration, favorable for nucleation and crystallization, and may reduce oxidation and denaturing of protein. Solid areas (24), preferably made of plastic, shape the open ended tubes (25) in which the protein solution is placed. A small lip (26) protruding from the bottom of the tube may help to confine the drop and its crystal contents to the open, X-ray-accessible area of the tube, and keep them from wetting the bottom surface of the central supporting member (24). As in previously described designs, the top and bottom of each cell is sealed with a vapor impermeable, optically and preferably X-ray transparent film (27). Since the drops are essentially hanging, the reservoir solution with which they equilibrate may be accommodated either in a tube or in a well (28) that is an integral part of the injection-molded plate.

Figure 4B:
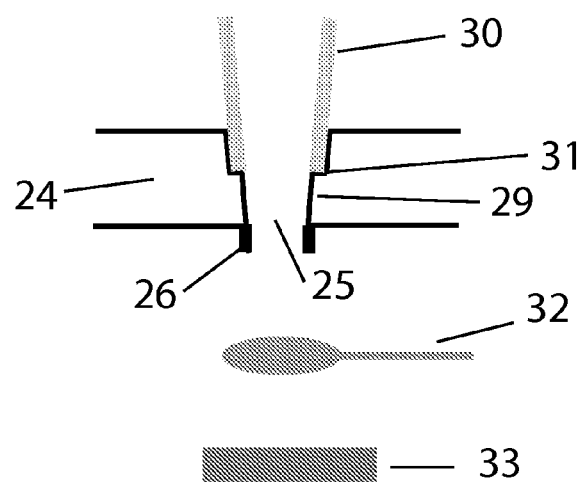
FIG. 4(b) shows one tube of a plate in the embodiment of FIG. 4(a) and a method for retrieving crystals from it.
Figure 5A:
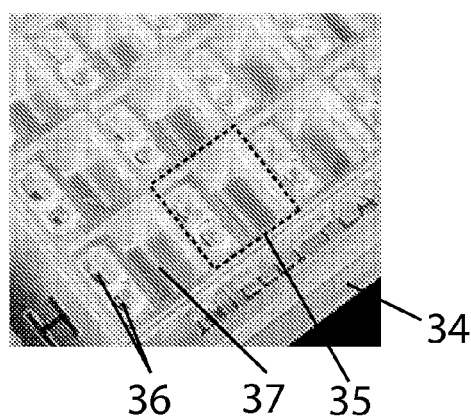
FIG. 5(a) shows the cell structure of a 96 cell crystallization plate, as known in the prior art.
Figure 5B:
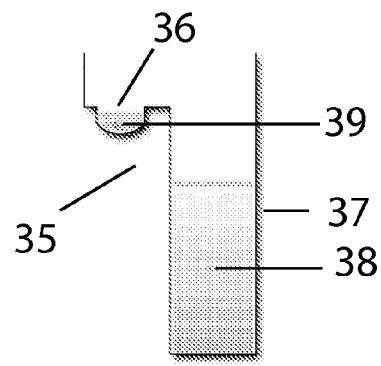
FIG. 5(b) shows detail of a single cell of the plate of FIG. 5(a), showing the well for the protein-free solution and the support for the protein-containing drop.

The shape of the tube (25) may be modified in other ways, as shown in FIG. 4(b). For example, it may be tapered (29) from top to bottom, as in the tip of a pipette. This draws liquid down to the bottom by capillary action, regardless of the volume dispensed into the tube. This tapered shape may match the shape of the liquid dispensing tip (30), and have an indentation (31) to capture and seal the tip. This design eliminates volume-dispensing errors caused by liquid that wets around the outer edge of the dispensing tip, leading to more accurate and reproducible crystallization experiments.

Tubes (25) also provide additional flexibility in retrieving crystals for subsequent X-ray examination. A liquid dispensing tip (30) exerts positive pressure at the top of the tube (FIG. 4(b)) to push the tube contents onto an X-ray mount (32). In one embodiment, the mount (32) is a MicroMesh™-like mount sold by Mitegen, LLC. An absorbent pad (33) sucks liquid through the mount (32). The mount (32) may be displaced laterally or rotated during this process to separate crystals deposited on its surface. This "vertical capillary" design, when used with parallel liquid dispensing heads for rapid filling, is more practical than other capillary-based approaches to crystallization and delivers many of their advantages.

Some of the novel features of these embodiments (shown in FIGS. 1-4) are listed here.

- Multiwell plate for protein crystallization with excellent optical transparency in the 5-20 keV range used in crystallography.
- In a preferred embodiment, multiwell plate for protein crystallization with excellent X-ray transparency in the 5-20 keV range used in crystallography.
- The plate frame preferably has an open cell design—i.e. cells are open at top and bottom, and not sealed at the bottom by an integral, thick plastic part of the frame as in conventional plates.
- Both sides of the plate are preferably sealed with thin optically transparent plastic films.
- The films may be X-ray transparent (of plastic, and less than 100 microns thick and preferably 25 microns thick or smaller) and provide good barriers to evaporation of water and other volatile compounds that may be present in crystallization media.
- Frame of plate is preferably very thin (few mm) with a large width-to-thickness ratio, reducing storage requirements, reducing convection, slowing vapor equilibration, and improving crystallization kinetics.
- Large width-to-thickness ratio maximizes viewing angle and incident X-ray beam angle.
- Frame may have "scoring" marks to facilitate cutting and removal of the film around each cell.
- Frame may have circular cells, allowing a circular cutting tool to remove the plastic films in each cell for easy crystal retrieval.
- Films and/or frames may be stamped or bar-coded to identify the drop pattern, crystallization experiment, and individual cell.
- Drops are preferably maintained in place by contact line pinning produced by chemical or topographic (0.2 mm or less—much smaller than the drop height) relief rather than by conventional millimeter-to-centimeter deep wells.
- One or both plastic films are patterned mechanically and/or chemically to obtain strong drop contact line pinning, for both protein containing and protein free ("reservoir") drops, which equilibrate with each other. The thickness or height of the walls may be minimized and still hold the drops in place. Molded wells for the protein and reservoir solution of standard crystallization trays can be eliminated.
- Film pattern is preferably made by laminating or gluing of two or more layers of plastic with different hole patterns and chemical (e.g., wetting) properties, or by stamping, embossing, contact or ink-jet printing, or lithographic patterning.
- Plate may be used in any orientation, allowing both sitting and hanging drop growth in the same apparatus.
- Thinness of film below protein-containing drops allows it to be flexed, allowing crystals to be easily detached without damage.
- Film can be thinner near the inside perimeter of the cell wall to facilitate cutting and removal.
- An additional sheet or film may be placed near the middle of the frame to hold the drops.
- This film or sheet may have holes to support drops by their edges only, or be patterned to strongly pin the drop contact lines.
- The cells may have vertically-oriented tubes to contain the liquids, with the tubes open at both ends.
- The tubes may be tapered from top to bottom to draw liquid down to their bottom.
- The tubes may have a small lip to help confine the liquid to the diameter of the tube and keep it from wetting the outer sides.

Some advantages of these embodiments (shown in FIGS. 1-4 and FIG. 10) over existing macromolecular crystal growth technologies are listed here.

- Precise control of the drop contact line.
- Precise control of the position, shape and surface area of both the protein and reservoir solution drops.
- Containment of protein and reservoir solutions on a single surface, allowing both hanging and sitting drop growth with the same plate.
- Very low X-ray background scatter so that X-ray diffraction experiments may be performed in situ without removing crystals.
- Large entrance and exit angles for the X-rays due to the shallow cells allow an X-ray detector to sample a larger part of reciprocal space/larger range of diffracted angles.
- Precise control over surface areas provides precise control of the protein-well solution equilibration rate and of evaporation from the protein drop. This translates into more reproducible nucleation and crystallization behavior.
- Increased maximum volume of hanging drops (limited by drop motion during inversion).
- Improved stability of the drop contact line position against motion caused by vibration and tilting.
- Greatly simplified optical imaging and automated image recognition of crystals in the drops because of the non-distorting parallel film configuration, and drop position and shape reproducibility is improved compared with conventional crystallization trays.
- Greatly simplified crystal retrieval since crystals are less likely to be stuck to the substrate (hanging drop, edge supported drops) and because the drops are on flat surfaces instead of contained in curved or square bottom wells. Adhered crystals are easily removed by flexing the plastic film.
- Complete compatibility with drop dispensing robots now widely available in academic and industrial laboratories—i.e., complete compatibility with the dominant technology.
- Easy customization of film pattern, and therefore easy customization of drop configurations, sizes, and growth parameters. A single injection molded frame may be used with many different film layouts, increasing flexibility in manufacturing and application.
- Roughly a factor of five reduction in storage space requirements.

Alternative Embodiments that Need Not be X-ray Transparent

Figure 6:
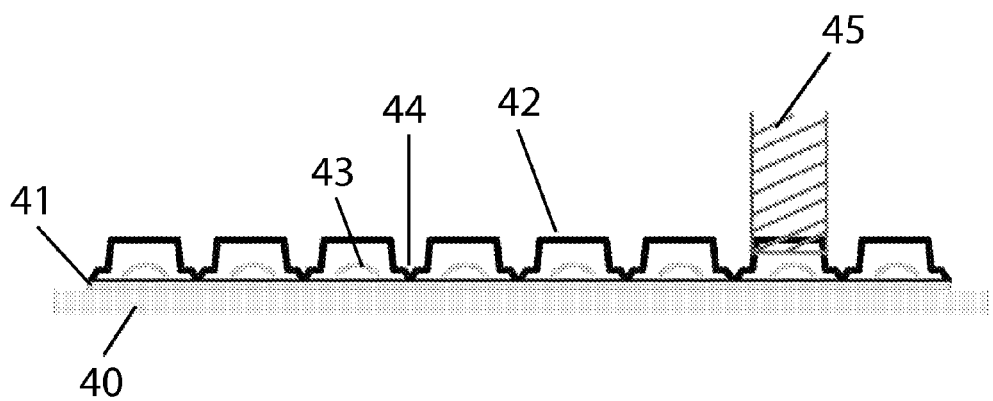
FIG. 6 shows a side view of a plate in another embodiment of the present invention, having a flat pattered substrate onto which liquid drops are dispensed, and that is sealed by detachable caps.
Figure 7A:
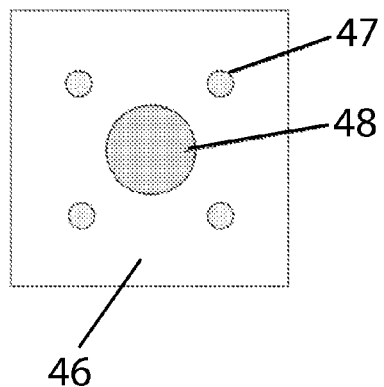
FIG. 7(a) shows a top view the bottom drop-supporting substrate in a single cell of the plate of FIG. 6, showing the substrate pattern for holding drops using the vapor diffusion growth method.
Figure 7B:
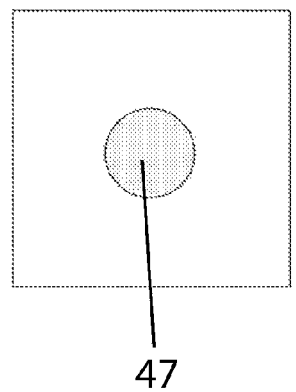
FIG. 7(b) shows a top view of the bottom drop-supporting substrate in a single cell of the plate of FIG. 6, showing the substrate pattern for holding drops using the batch growth method.
Figure 7C:
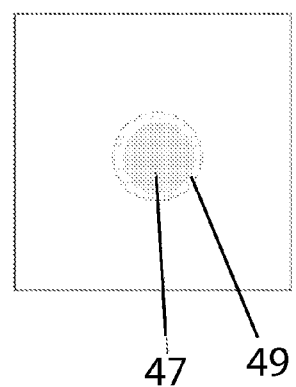
FIG. 7(c) shows a top view of the bottom drop-supporting substrate in a single cell of the plate of FIG. 6, showing the substrate pattern for holding drops using the batch growth method under oil.
Figure 8A:
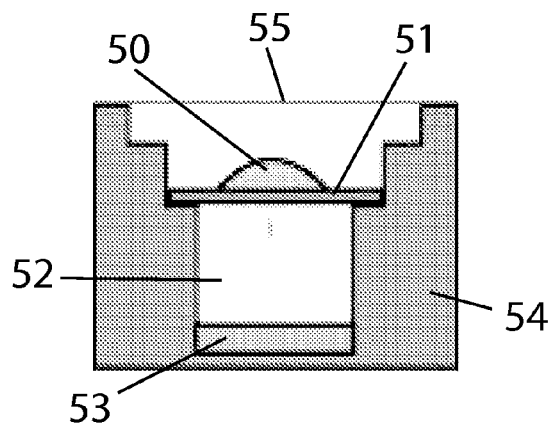
FIG. 8(a) shows a manual method of sitting drop crystal growth.
Figure 8B:
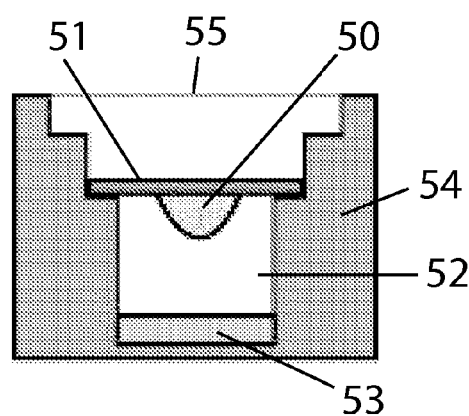
FIG. 8(b) shows a manual method of hanging drop crystal growth.
Figure 8C:
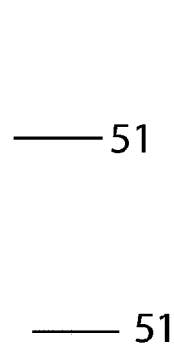
FIG. 8(c) shows circular glass or plastic coverslips used to support the drop in FIGS. 8(a) and 8(b).
Figure 8D:
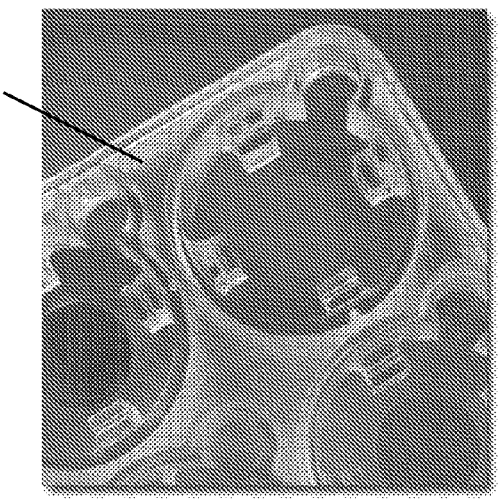
FIG. 8(d) shows a crystallization plate for use in manual sitting or hanging drop crystal growth as known in the prior art.

Another possible design for a crystallization plate that eliminates wells and uses chemical or topographic patterning to define the drop positions and shapes is shown in FIGS. 6 and 7. It includes a flat glass (or plastic) plate (40), a sealing gasket (41), and an optically transparent cover (42).

The flat plate (40) is preferably optically clear, and is chemically or topographically patterned using methods related to those shown in FIG. 10. The overall pattern includes rectangular or circular cells (46) containing one or more spots (47, 48) onto which protein solution (47) and reservoir solution (48) is deposited, as shown in FIGS. 7(*a*) and 7(*b*). FIGS. 7(*a*) through 7(*b*) show a pattern of chemical and/or topographically defined areas that localize drop contact lines on glass or plastic substrates. More specifically, FIG. 7(*a*) shows the pattern for vapor diffusion growth of crystals, and FIG. 7(*b*) shows the pattern for batch growth of crystals. FIG. 7(*c*) shows a pattern for batch growth of a protein drop under oil. The protein drop (47) is covered with a drop of oil. The substrate preferably has an annular pattern (49) to pin both the protein drop and oil in this embodiment.

In the case of batch crystal growth, each cell (46) may contain one or several patterned spots of similar or identical size. In the case of vapor diffusion growth, each cell may contain one or several small patterned spots (e.g., from 0.1 to 1 mm diameter, for drops from nl to ml volume) for protein-containing solutions (47) as well as one or more large spots (1-5 mm diameter) onto which a protein-free reservoir solution (48) with which the protein drops can equilibrate is placed. The patterning provides both excellent drop shape reproducibility and surface to volume reproducibility—thus enhancing control over crystal growth experiments—and also allows both large and small drops to be flipped over into a hanging drop configuration without either sliding off or becoming distorted. A die-cut adhesive gasket (41) may be affixed to the plate and then the chemically patterned/treated surface protected with a removable cover (42) held in place by the gasket. The overall thickness of the plate with gasket is preferably roughly 2-4 mm.

The optically transparent cover (42) is preferably attached to the glass plate using a die-cut adhesive gasket (41). Alternatively, the gasket may attach the cover to the glass plate by another bonding method, including, but not limited to, thermal bonding. The cover preferably includes several features. It is preferably divided into several compartments (43), matching the patterned cells on the glass plate, to seal each cell and isolate it from its neighbors. It has an optically flat top, to allow high quality illumination or imaging of the drops below. It is preferably made of a plastic including, but not limited to, polystyrene, a polymer like PDMS, or glass, so that it is mechanically tough.

The cover is preferably scored (44) or patterned (in the case of a hard plastic cover) so that a special removal tool (45) (e.g., a simple square or round gripper, or a vacuum gripper) may be used to snap out and remove the cover of each cell individually, for crystal retrieval. For a soft cover made of, e.g., PDMS, the cover of each well may be removed by cutting with a sharp blade. The cover does not need to be a single, continuous piece. For example, individual cell "caps" may be fabricated, and then held together using a die-cut adhesive gasket that matches the pattern of the cells on the plate. This reduces manufacturing costs (especially the cost of molds), provides greater flexibility in plate layout, and makes removal of cell caps trivial using a gripper (45). The gripper (45) matches the shapes of the cells (e.g.—for cylindrical cells, the gripper (45) is cylindrical) and removes the optical cover (42) from individual cells (46). The overall height of the cover is preferably minimized, to provide minimal clearance between the top of the drop and the inside of the cover. For typical drop sizes, a vertical height of approximately 2-3 mm is sufficient. Thus, the overall height of the crystallization plate plus cover is preferably 5-6 mm, or roughly ⅓ the height of commercial high-throughput crystallization plates. Because of the very small volume of the enclosed space within each cell and the good vapor impermeability of the cell materials, a very small well solution volume (as little as a few microliters) is sufficient to provide good equilibration with 100 nl drops.

In a typical application, the protective covering is removed from the glass plate. Reservoir solution and protein solution drops are dispensed onto the plate using either manual pipetters or a high-speed drop-dispensing robot specifically programmed for the pattern on the plate. The optically transparent cover is then transported over the plate (either manually or using a vacuum gripper) and then sealed to the plate. The plate is then stored in the dispensing orientation for sitting drops, or inverted for hanging drops. Each cell in each plate is then periodically inspected using an automated image acquisition system. When a suitable crystal is detected in a cell, a manual or robotic tool removes the cover of the cell to allow crystal retrieval. The low profile of the cover allows easy crystal retrieval.

This embodiment is suitable for optical examination of crystals within the apparatus. Often the crystals are as small as 10-20 microns and are barely visible in a good microscope. So any optical distortion or birefringence caused by the plate is a huge problem. The drops often have tiny crystals as well as tiny blobs of precipitate, and bad optical resolution makes it difficult to distinguish the crystals from the precipitate. This embodiment overcomes these problems, and permits in situ optical examination.

Some advantages of this embodiment (shown in FIGS. 6-7) over existing macromolecular crystal growth technologies are listed here.

Precise control of the drop contact line.
Precise control of the position, shape and surface area of both the protein and well solution drops.
Precise control over surface areas provides precise control of the protein-well solution equilibration rate and of evaporation from the protein drop. This translates into more reproducible nucleation behavior.
Increased maximum volume of hanging drops (limited by drop motion during inversion).
Improved stability of the drop contact line position against motion caused by vibration and tilting.
Greatly simplified optical imaging of crystals in the drops because of the non-distorting parallel plate configuration.
Greatly simplified crystal retrieval since crystals are less likely to be stuck to the substrate (hanging drop configuration) and because the drops are on flat surfaces instead of contained in curved or square bottom wells.
Complete compatibility with drop dispensing robots now widely available in academic and industrial laboratories—i.e., complete compatibility with the dominant technology.
Easy customization of surface pattern, and therefore easy customization of drop configurations, sizes, and growth parameters.
Very thin plates are possible, so that storage space requirements are reduced by a factor of three over commercial plates.
Since most crystallizations are done in the hanging drop configuration, the progress of crystallization in each drop may be inspected from the top through the flat, non-distorting glass or plastic of the substrate, which simplifies automated analysis of the contents of the drops.

Surface Patterning of Glass and Plastic Coverslips for Manual Crystal Growth

Although the focus of all the preceding embodiments is on crystallization plates for high-throughput crystallization, the same surface patterning concept may be used for low-throughput manual crystallization using glass or plastic coverslips. The basic methods and apparatus used for this kind of crystallization are shown in FIGS. 8(*a*) and 8(*b*).

FIG. 8(*a*) shows the sitting drop method, where the drop (50) sits on top of the coverslip (51), which is the supporting substrate. Crystals tend to sediment onto the coverslip (51) in this method. FIG. 8(*b*) shows the hanging drop method, where the substrate coverslip (51) is inverted so that the drop (50) hangs from its bottom, and crystals sediment to the liquid-air interface. Both the sitting drop method and the hanging drop method can be used with either the batch or vapor diffusion methods. In each of these methods, the coverslip (51) may be suspended over a reservoir (52) containing a solution (53) with a lower initial vapor pressure than that of the drop (50). This may be achieved by methods including, but not limited to, having a higher salt concentration or by adding polyethylene glycols. The reservoir (52) is sealed using transparent tape or a transparent plastic sheet (55), and water is removed from the drop (50) as it equilibrates with the reservoir solution (53), increasing the protein concentration until nucleation and crystal growth occur. The coverslips (51) used for these methods, shown in FIG. 8(*c*), are typically 22 millimeters in diameter and 0.22 millimeters in height. A portion of a commercial crystallization tray (54) designed for use with cover slips in manual hanging and sitting drop growth is shown in FIG. 8(*d*).

In this embodiment of the present invention, instead of a homogeneous surface (e.g., silanized glass slides sold by Hampton Research), the surface onto which a drop is deposited may be patterned by any of the methods described previously to strongly pin its contact line. In one example (FIGS. 9(*a*) through 9(*c*)), a circular area of the coverslip (51) with diameter comparable to or slightly smaller than the area the drop (50) occupies on an untreated surface is treated to increase the attractive interaction and wetting of the drop to the substrate. The area surrounding the circular pattern is untreated or else treated to reduce the wetting and interaction of the drop. In this way, the contact line of the drop is strongly pinned to the boundary between the strongly wetting and weakly wetting surface regions, and the contact angle hysteresis in this region is strongly increased.

Figure 9A:
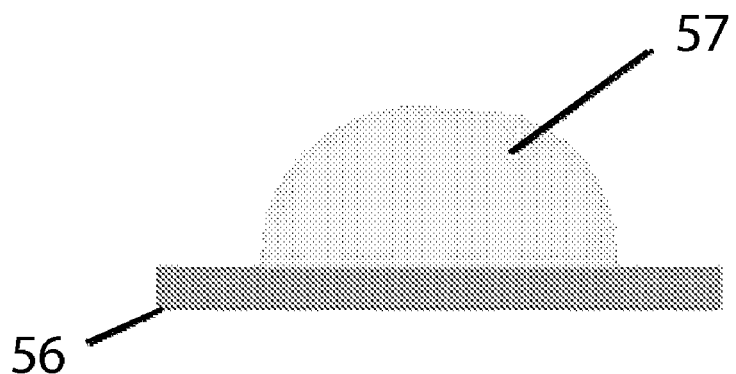
FIG. 9(a) shows an etching method used to pattern a circular hydrophilic area on a hydrophobic glass substrate, that could be used in the embodiment of FIG. 6 or to replace the glass coverslips in FIG. 8(d) to provide strong pinning of drop contact lines.
Figure 9B:
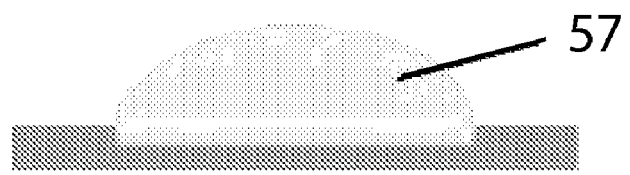
FIG. 9(b) shows a silanized glass substrate being etched by a drop of NaOH solution.
Figure 9C:
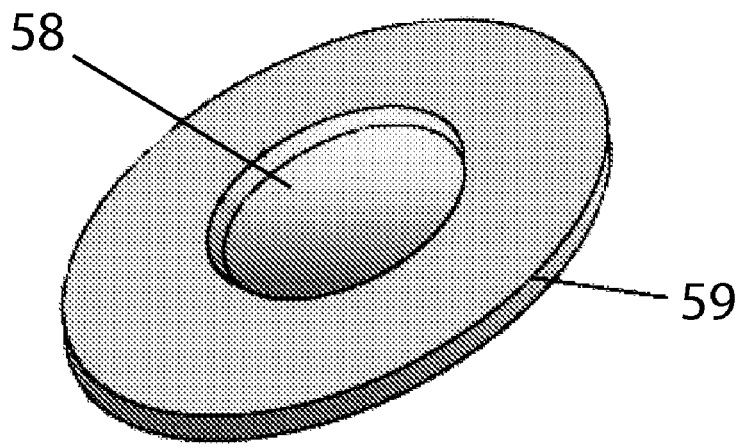
FIG. 9(c) shows the final patterned slide, having a very shallow hydrophilic circular depression surrounded by a hydrophobic surface.

As an example, a silanized glass slide (56) with hydrophobic characteristics are patterned by dispensing a drop of a 1M NaOH solution (57) using a pipette, as shown in FIG. 9(*a*). This solution etches and removes the hydrophobic silanol film and a smaller (few micrometer) thickness of glass (via formation of soluble $Na_2SiO_3$ silicates) (FIG. 9(*b*)) and results in a circular pattern (58) on the slide that provides both chemical and topographic contrast to pin the drop contact line (FIG. 9(*c*)). To speed up the glass/base reaction the substrate is preferably heated to 100° C. in air. After evaporation of the NaOH drop, the slide surface is rinsed with deionized water and dried in a $N_2$ gas stream. The result is a patterned slide (59) with a circular hydrophilic pattern (58) in a hydrophobic background. The strong pinning not only guarantees that the drop has a reproducible position and shape, but also makes the shape much more robust to forces caused by handling and by flipping to obtain a hanging drop.

The required surface treatments depend on the surface material to be treated (glass or plastic) and on the general properties of the protein drop, i.e., whether a hydrophobic or hydrophilic surface is desired. Some of these treatments are shown in FIG. 10. A wide variety of surface treatments for glass and various plastics are also provided in the scientific literature. Depending on the treatment, the circular drop pattern is preferably fabricated by wet etching (either using a carefully dispensed drop or through a mechanical or deposited film mask), by dry etching through a mask, by a stamping process, or by ink jet printing. The entire area of the substrate may be pretreated to obtain desired surface properties. The technology used to make the "spots" on protein and DNA microarray chips may be suitable as a treatment in this embodiment of the present invention.

In this embodiment, the glass coverslips (51) in FIGS. 8(*a*) through 8(*d*) are replaced with glass coverslips (59) with a treated/patterned surface, upon which the sitting drop method (FIG. 8(*a*)) and the hanging drop method (FIG. 8(*b*)) may be performed.

Other patterning methods include, but are not limited to, coating with photoexposable polyimide (hydrophobic, resistant to all chemicals), then photolithographically defining holes or rings, which can then be chemically treated to make them hydrophilic; coating with a Teflon® coating, silanes, PEG-related compounds; mechanical stamping (e.g., using PDMS), or ink jet or contact printing.

Patterns are not restricted to, e.g., a hydrophilic (hydrophobic) circle patterned on a hydrophobic (hydrophilic) surface, but may include circles with annular regions surrounding them having different properties, as discussed above. These may be used, for example to control both the protein drop and covering oil layer's geometry in microbatch under oil crystallization.

Some advantages of these embodiments (FIGS. 8 and 9) over using uniform glass or plastic coverslips in manual crystallization are listed below.

Precise control of the drop contact line.

Precise control of the position, shape and surface area of both the protein and well solution drops.

Precise control over surface areas provides precise control of the protein-well solution equilibration rate and of evaporation from the protein drop. This translates into more reproducible nucleation behavior.

Increased maximum volume of hanging drops (limited by drop motion during inversion).

Improved stability of the drop contact line position against motion caused by vibration and tilting.

Control of drop position, shape and surface-tension-driven convection in the batch drop under oil method.

Patterning of an arbitrary number and arrangement of spots of arbitrary sizes.

Need for specialized crystallization plates is greatly reduced. Both hanging and sitting drops together with large drops of well solution may be implemented on a flat plate, with no need for fabricated compartments to hold each drop.

Easy customization of surface pattern, and therefore easy customization of drop configurations, sizes, and growth parameters.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A screening and crystallization plate for manual and high-throughput biological and organic crystal growth comprising:

a plurality of cells open at a top and a bottom;

a frame that defines the cells in the plate;

at least one first film or layer sealing a bottom of the plate;

at least one second film sized to seal the a top of the plate; and at least one sealer for sealing the second film to the plate after at least one liquid drop is dispensed on the first film or layer;
wherein the first film or layer is patterned to produce strong pinning at at least one location on the film or layer of at least one contact line of the at least one liquid drop to be dispensed onto the first film or layer.

2. The plate of claim 1, wherein the first film or layer and the second film are x-ray transparent.

3. The plate of claim 1, wherein the frame comprises a plurality of scoring marks to facilitate cutting and removal of the film or layer around each cell.

4. The plate of claim 1, wherein the cells are circular such that a circular cutting tool removes at least one of the films or layers covering the cells to retrieve at least one crystal.

5. The plate of claim 1, wherein at least one of the films or layers is stamped or bar-coded to identify the plate or each individual cell.

6. The plate of claim 1, wherein a region of the first film or layer that is patterned has at least one chemical property related to contact line pinning that is different from a chemical property of a region of the first film or layer that is unpatterned.

7. The plate of claim 1, wherein the first film or layer is patterned to produce strong contact line pinning at at least one specific location on the first film or layer, and where a dimension of a pattern perpendicular to a plane of the film or layer is smaller than a height of the at least one liquid drop to be dispensed onto the film or layer.

8. The plate of claim 1, further comprising a third film or a sheet placed near a middle of the frame, wherein the third film or the sheet holds the drops.

9. The plate of claim 8, wherein the third film or the sheet is patterned to produce strong pinning at at least one position on the film or sheet of at least one contact line of the at least one liquid drop dispensed onto the third film or the sheet, and wherein a dimension of the pattern perpendicular to a plane of the film or sheet is smaller than a height of the at least one liquid drop to be dispensed onto the film or sheet.

10. The plate of claim 1, wherein the films or layers are made of plastic.

11. The plate of claim 1, wherein the cells are rectangular.

12. The plate of claim 1, wherein the sealer comprises a gasket.

13. The plate of claim 1, wherein at least one drop containing at least one molecule to be crystallized and at least one reservoir drop are held on the first film or layer.

14. The plate of claim 1, wherein the first film or layer and the second film are optically transparent.

15. A crystallization apparatus comprising:
a crystallization plate designed for use with at least one coverslip; and
at least one coverslip comprising at least one patterned area and at least one unpatterned area such that the patterned area produces stronger contact line pinning of at least one liquid drop at at least one location on the coverslip than on an unpatterned coverslip;
wherein the coverslip is a medium to hold the drop.

16. The apparatus of claim 15, wherein the pattern comprises at least one disk or at least one ring, and wherein a dimension of the disk or ring perpendicular to the plane of the coverslip is smaller than a height of the at least one liquid drop to be dispensed onto the coverslip.

17. The plate of claim 7, wherein a dimension of the surface pattern perpendicular to the plane of the film or layer is between 1 and 50 microns.

18. The plate of claim 7, wherein a dimension of the surface pattern perpendicular to the plane of the film or layer is at least 50 microns.

19. The plate of claim 1, wherein a surface topography of the first film or layer is patterned to produce strong pinning at at least one location on the film or layer of at least one contact line of the at least one liquid drop dispensed onto the first film or layer.

20. A plate for biological research, comprising:
a plurality of cells open at a top and a bottom;
a frame that defines the cells in the plate;
at least one first film or layer sealing a bottom of the plate;
at least one second film sized to seal a top of the plate; and
at least one sealer for sealing the second film to the plate after at least one liquid drop is dispensed on the first film or layer;
wherein the first film or layer is patterned to produce strong pinning at at least one location on the film or layer of at least one contact line of the at least one liquid drop dispensed onto the first film or layer.

21. The plate of claim 20, wherein at least one of the films or layers is stamped or bar-coded to identify the plate or each individual cell.

22. The plate of claim 20, wherein a surface pattern of the film or layer comprises a plurality of circular disks, a plurality of elliptical disks, a plurality of circular rings, a plurality of elliptical rings, at least one set of concentric circular rings, or at least one set of concentric elliptical rings, and wherein a disk or ring height or depth perpendicular to a plane of the film is smaller than a height of the at least one liquid drop to be dispensed onto the film or layer.

23. The plate of claim 20, wherein a region of the first film that is patterned has at least one chemical property related to contact line pinning that is different from a chemical property of a region of the first film that is unpatterned.

24. The plate of claim 20, wherein the films or layers are made of plastic.

25. The plate of claim 20, wherein the sealer comprises a gasket.

26. The plate of claim 20, wherein the first film or layer and the second film are optically transparent.

27. The plate of claim 22, wherein a width of the rings is 5 to 100 microns.

28. The plate of claim 20, wherein a dimension of a surface pattern perpendicular to a plane of the film or layer is between 1 and 50 microns.

29. The plate of claim 20, wherein a dimension of a surface pattern perpendicular to a plane of the film or layer is at least 50 microns.

30. The plate of claim 22, wherein a surface topography of the film or layer is patterned to define the disks or rings that pin contact lines.

31. A screening and crystallization plate for manual and high-throughput biological and organic crystal growth comprising:
a plurality of cells open at a top and a bottom;
a frame that defines the cells in the plate; and
at least one film or layer sealing a bottom of the plate;
wherein the film or layer is patterned to produce strong pinning at at least one location on the film or layer of at least one contact line of at least one liquid drop dispensed onto the film or layer.

32. The plate of claim 31, wherein the film or layer is x-ray transparent.

33. The plate of claim 31, wherein the film or layer is stamped or bar-coded to identify the plate or each individual cell.

34. The plate of claim 31, wherein a pattern of the film or layer comprises a plurality of circular disks, a plurality of elliptical disks, a plurality of circular rings, a plurality of elliptical rings, at least one set of concentric circular rings, or at least one set of concentric elliptical rings, and wherein a dimension of the pattern perpendicular to a plane of the film or layer is smaller than a height of the at least one liquid drop to be dispensed onto the film or layer.

35. The plate of claim 31, wherein a region of the film or layer that is patterned has at least one chemical property related to contact line pinning that is different from a chemical property of a region of the film that is unpatterned.

36. The plate of claim 1, wherein a pattern of the film or layer comprises a plurality of circular disks or a plurality of elliptical disks, and wherein a disk height or depth perpendicular to a plane of the film is smaller than a height of the at least one liquid drop to be dispensed onto the film.

37. The plate of claim 1, wherein a pattern of the film or layer comprises a plurality of circular rings, a plurality of elliptical rings, at least one set of concentric circular rings, or at least one set of concentric elliptical rings, and wherein a ring height perpendicular to a plane of the film or layer is smaller than a height of the at least liquid drop to be dispensed onto the film or layer.

38. The plate of claim 37, wherein a width of the rings is smaller than a diameter of the rings.

39. The plate of claim 37, wherein a width of the rings is 5 to 100 microns.

40. The plate of claim 36, wherein a dimension of the surface pattern perpendicular to the plane of the film or layer is between 1 and 50 microns.

41. The plate of claim 36, wherein a dimension of the surface pattern perpendicular to the plane of the film or layer is at least 50 microns.

42. The plate of claim 36, wherein a dimension of the surface pattern perpendicular to the plane of the film or layer is less than 200 microns.

43. The plate of claim 37, wherein a dimension of the surface pattern perpendicular to the plane of the film or layer is between 1 and 50 microns.

44. The plate of claim 37, wherein a dimension of the surface pattern perpendicular to the plane of the film or layer is at least 50 microns.

45. The plate of claim 37, wherein a dimension of the surface pattern perpendicular to the plane of the film or layer is less than 200 microns.

46. The plate of claim 7, wherein a dimension of a surface pattern perpendicular to the plane of the film or layer is less than 200 microns.

47. The plate of claim 20, wherein a dimension of a surface pattern perpendicular to a plane of the film or layer is less than 200 microns.

48. The plate of claim 1, wherein a position on the first film or layer of at least one contact line of the at least one drop dispensed onto the first film or layer is fixed by a pattern, and wherein the at least one liquid drop is held in place on the first film or layer by the pattern.

49. The plate of claim 48, wherein the contact line of the at least one liquid drop will not move from its place on the first film or layer when the plate is inverted.

* * * * *